United States Patent
Choi et al.

(10) Patent No.: US 9,853,096 B1
(45) Date of Patent: Dec. 26, 2017

(54) DISPLAY WITH INACTIVE AREA SURROUNDED BY ACTIVE AREA

(71) Applicant: Apple Inc., Cupertino, CA (US)

(72) Inventors: Jae Won Choi, Cupertino, CA (US); Chin-Wei Lin, Cupertino, CA (US); Minhyuk Choi, San Jose, CA (US); Shih Chang Chang, Cupertino, CA (US); Tsung-Ting Tsai, Santa Clara, CA (US); Young Bae Park, San Jose, CA (US); John Z. Zhong, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/257,408

(22) Filed: Sep. 6, 2016

Related U.S. Application Data

(60) Provisional application No. 62/220,397, filed on Sep. 18, 2015.

(51) Int. Cl.
*H01L 27/32* (2006.01)
*H01L 27/12* (2006.01)

(52) U.S. Cl.
CPC ...... *H01L 27/3276* (2013.01); *H01L 27/3246* (2013.01); *H01L 27/3262* (2013.01); *H01L 27/124* (2013.01)

(58) Field of Classification Search
CPC . H01L 21/775; H01L 27/12; H01L 29/66765; H01L 29/4908
See application file for complete search history.

(56) References Cited

U.S. PATENT DOCUMENTS

| | | | |
|---|---|---|---|
| 7,649,578 B2 | 1/2010 | Kwon et al. | |
| 9,261,743 B2 * | 2/2016 | Park | G02F 1/13452 |
| 2010/0273530 A1 | 10/2010 | Jarvis et al. | |
| 2012/0218219 A1 | 8/2012 | Rappoport et al. | |
| 2014/0049522 A1 | 2/2014 | Mathew et al. | |
| 2014/0055702 A1 | 2/2014 | Park et al. | |

* cited by examiner

*Primary Examiner* — Quoc Hoang
(74) *Attorney, Agent, or Firm* — Treyz Law Group, P.C.; G. Victor Treyz

(57) ABSTRACT

A display may have an active area with an array of pixels to display images. An inactive area in the display may be formed from an opening in the active area. The inactive area may be enclosed by the pixels in the active area. An inactive border may run along an edge of the inactive area. A grid of positive power supply lines may be used to supply power to the pixels. Initialization voltage lines may be used to distribute initialization voltages to the pixels for use during transistor threshold voltage compensation operations. The inactive border may be free of positive power supply lines and initialization voltages lines. Control signal lines and data lines may pass through the inactive border to supply control signals and data signals respectively to the pixels. The display may have thin-film transistor circuitry with multiple layers of data lines.

20 Claims, 9 Drawing Sheets

DISPLAY WITH INACTIVE AREA SURROUNDED BY ACTIVE AREA

This application claims the benefit of provisional patent application No. 62/220,397, filed Sep. 18, 2015, which is hereby incorporated by reference herein in its entirety.

BACKGROUND

This relates generally to electronic devices and, more particularly, to electronic devices with displays.

Electronic devices often include displays. A display may have an array of pixels for displaying images. In displays such as organic light-emitting diode displays, each pixel may contain a light-emitting diode and thin-film transistor circuitry that that controls current flow through the organic light-emitting diode. Conductive signal paths on a display may be used to route signals to the pixels.

In some scenarios, it may be desirable for the conductive signals paths in a display to run vertically and horizontally across a display. This type of signal path scheme may not, however, be appropriate for all types of display.

It would therefore be desirable to be able to provide displays with improved signal routing schemes.

SUMMARY

A display may have an active area with an array of pixels that display images. An inactive area of the display may be formed within the active area. The inactive area may be an enclosed inactive area that is surrounded by the pixels in the active area and that is formed from an opening in the active area. An inactive border may run along a peripheral edge of the inactive area. Signal lines and power supply lines may be formed in a pattern on the display that helps reduce the width of the inactive border.

A grid of positive power supply lines may be used to supply power to the pixels. Initialization voltage lines may be used to distribute initialization voltages to the pixels for use during transistor threshold voltage compensation operations. Some of the initialization voltage lines may be segmented and may have one segment that lies on one side of the inactive area and a another segment that lies on an opposing side of the inactive area. The inactive border may be free of the positive power supply lines and initialization voltages lines.

Control signal lines and data lines may pass through the inactive border to supply control signals and data signals respectively to the pixels. The display may have thin-film transistor circuitry with multiple layers of data lines. The use of multiple layers of data lines may allow data signals to be routed around the inactive area using the inactive border while minimizing the width of the inactive border.

Further features will be more apparent from the accompanying drawings and the following detailed description.

DETAILED DESCRIPTION

Figure 1:
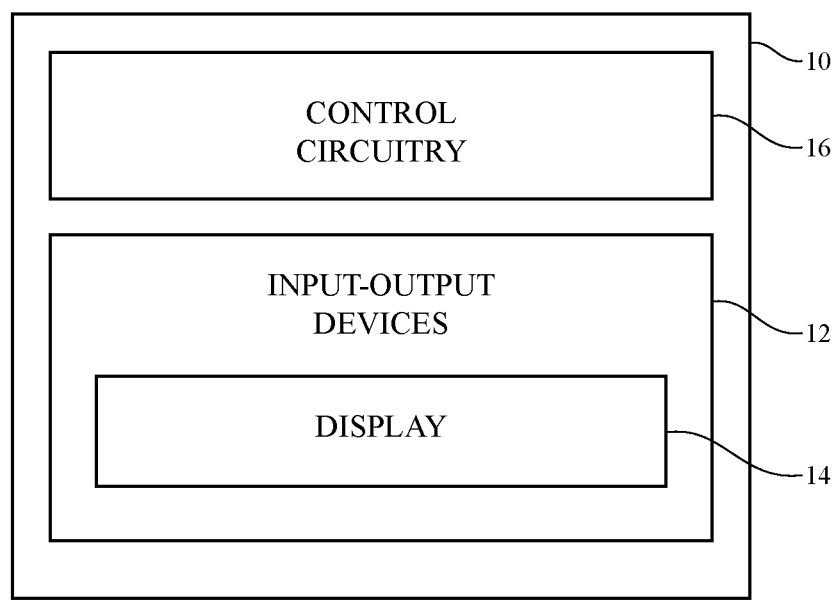
FIG. 1 is a diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Display 14 may be any suitable type of display. As an example, display 14 may include an array of light-emitting devices such as light-emitting diodes (e.g., organic light-emitting diodes, quantum dot light-emitting diodes, light-emitting diodes formed from discrete crystalline semiconductor dies, etc.) or other pixel structures for displaying images for a user of device 10. Configurations in which display 14 is an organic light-emitting diode display are sometimes described herein as an example.

Figure 2:
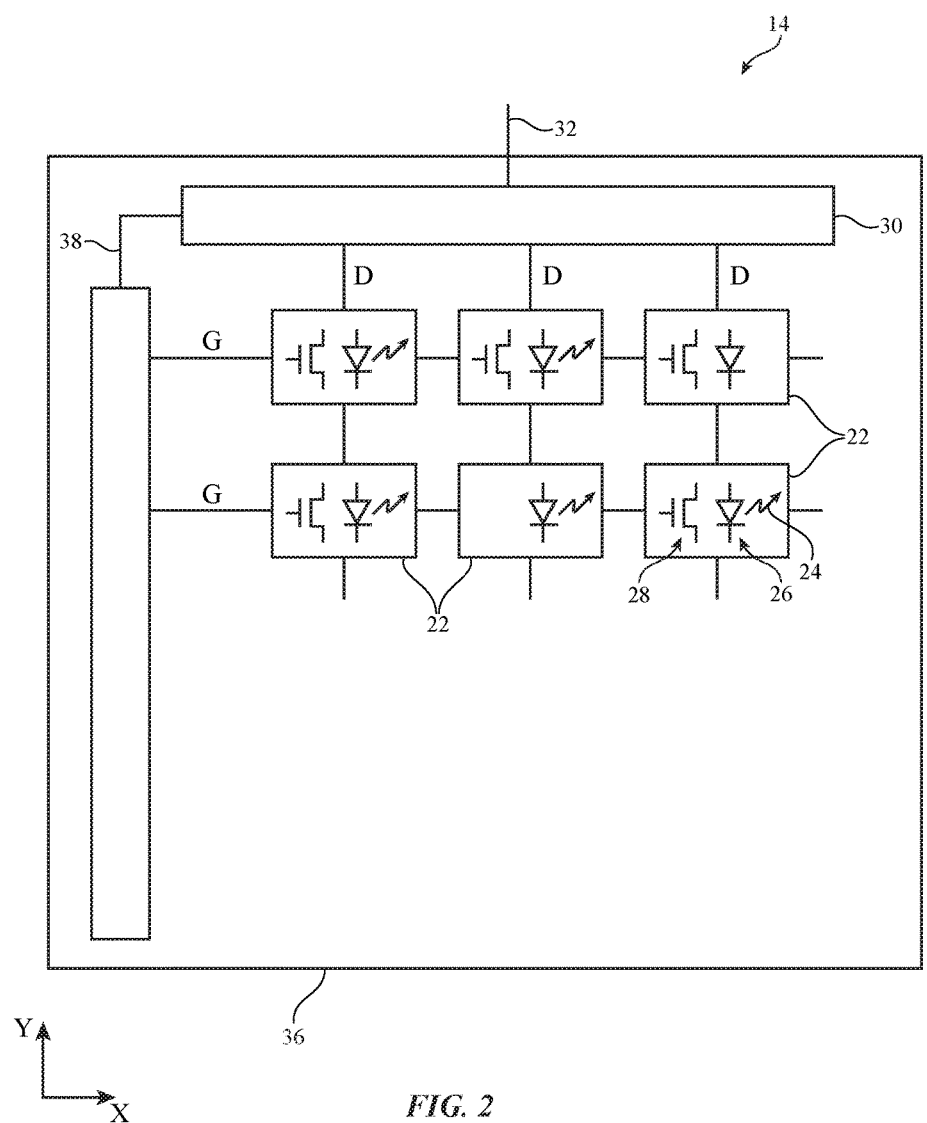
FIG. 2 is a diagram of an illustrative display in accordance with an embodiment.

FIG. 2 is a diagram of an illustrative light-emitting diode display such as an organic light-emitting diode display. As shown in FIG. 2, display 14 may have an array of pixels 22 for displaying images for a user. The array of pixels 22 may be arranged to form rows and columns. There may be any suitable number of rows and columns in the array of pixels 22 (e.g., ten or more, one hundred or more, or one thousand or more). Pixels 22 may each contain subpixels of different colors. As an example, each pixel 22 may have a red subpixel that emits red light, a green subpixel that emits green light, and a blue subpixel that emits blue light. Configurations for display 14 that include subpixels of other colors may be used, if desired.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, circuitry 30 may also supply clock signals and other control signals to gate driver circuitry on an opposing edge of display 14.

Gate driver circuitry 34 (sometimes referred to as horizontal control line control circuitry) may be implemented as part of an integrated circuit and/or may be implemented using thin-film transistor circuitry. Horizontal control lines G (sometimes referred to as gate lines) in display 14 may include scan line signals, emission enable control signals, and other horizontal control signals for controlling the pixels of each row. There may be any suitable number of horizontal lines per row of pixels 22 (e.g., one or more, two or more, three or more, four or more, etc.).

The circuitry for each pixel 22 may include an organic light-emitting diode such as diode 26 and a pixel circuit formed from transistors 28 (e.g., thin-film transistors) that controls the flow of current through diode 26 and thereby controls the amount of emitted light 24 from that pixel. The pixel circuits may each include a drive transistor that controls current flow through diode 26, supporting transistors (e.g., switching transistors and emission enable control transistors), and other circuitry (e.g., one or more thin-film capacitors). The supporting transistors may be used in performing data loading operations and transistor threshold voltage compensation operations for the drive transistors. Initialization voltage lines may supply initialization voltages to the pixel circuits of pixels 22 during transistor threshold voltage compensation operations.

Figure 3:
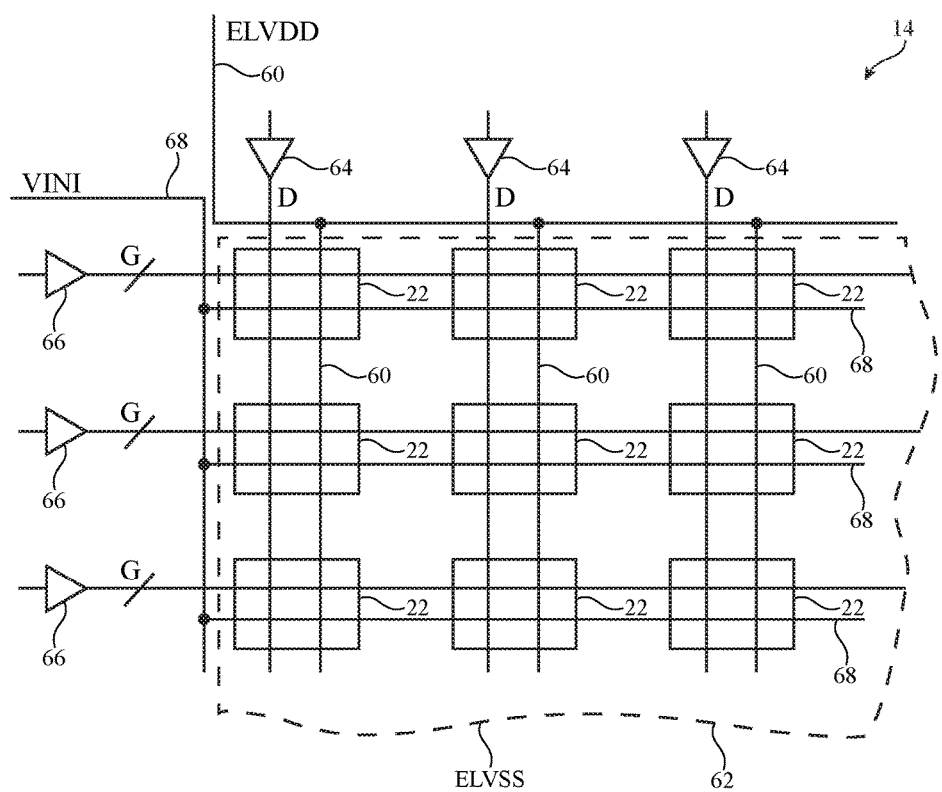
FIG. 3 is a diagram of a portion of an illustrative display showing signal lines that may be associated with the pixels of the display in accordance with an embodiment.

FIG. 3 is a diagram showing illustrative signal lines that may be provided in display 14 for operating the array of pixels 22 in display 14. As shown in FIG. 3, pixels 22 may all be provided with a shared positive power supply voltage signal ELVDD using positive power supply lines such as positive power supply lines 60. A ground power supply voltage ELVSS may be supplied to pixels 22 using a blanket transparent conductive layer such as layer 62 (i.e., a common cathode layer). Layer 62 may be formed from metal that is sufficiently thin to be transparent (as an example). Supplemental metal ground power supply voltage distribution lines may be formed in a grid that is shorted to layer 62 (e.g., to reduce the resistance of the ground power supply voltage distribution path in display 14 and thereby avoid ohmic losses—sometimes referred to as IR loses).

Data signals for columns of pixels 22 may be supplied using data line driver circuitry 64 in display driver circuitry 30 (FIG. 2) and individually controlled vertical data lines D. Each data line D may be associated with a respective column of pixels 22 and may be used in loading data into those pixels.

One or more horizontal control lines G (e.g., scan lines, emission control lines, etc.) may be associated with each row of pixels 22. Gate drivers 66 within gate driver circuitry 34 (FIG. 2) may be used in independently controlling the horizontal control lines of each row. An initialization voltage distribution path such as a path formed from lines 68 may be used in distributing an initialization voltage Vini to pixels 22 during drive transistor threshold voltage compensation operations.

Display 14 may have an active area that contains pixels 22 and that displays images for a user. The active area may be rectangular or may have other suitable shapes. Display 14 may also have an inactive border that runs along the edges of the active area (e.g., a rectangular ring-shaped border region in scenarios in which the active area of display 14 is rectangular). The inactive areas of display 14 such as the border of display 14 do not contain pixels and therefore do not display images for the user. Components such as display driver integrated circuit 30 and gate driver circuitry 34 may be formed in the inactive border of display 14.

Figure 4:
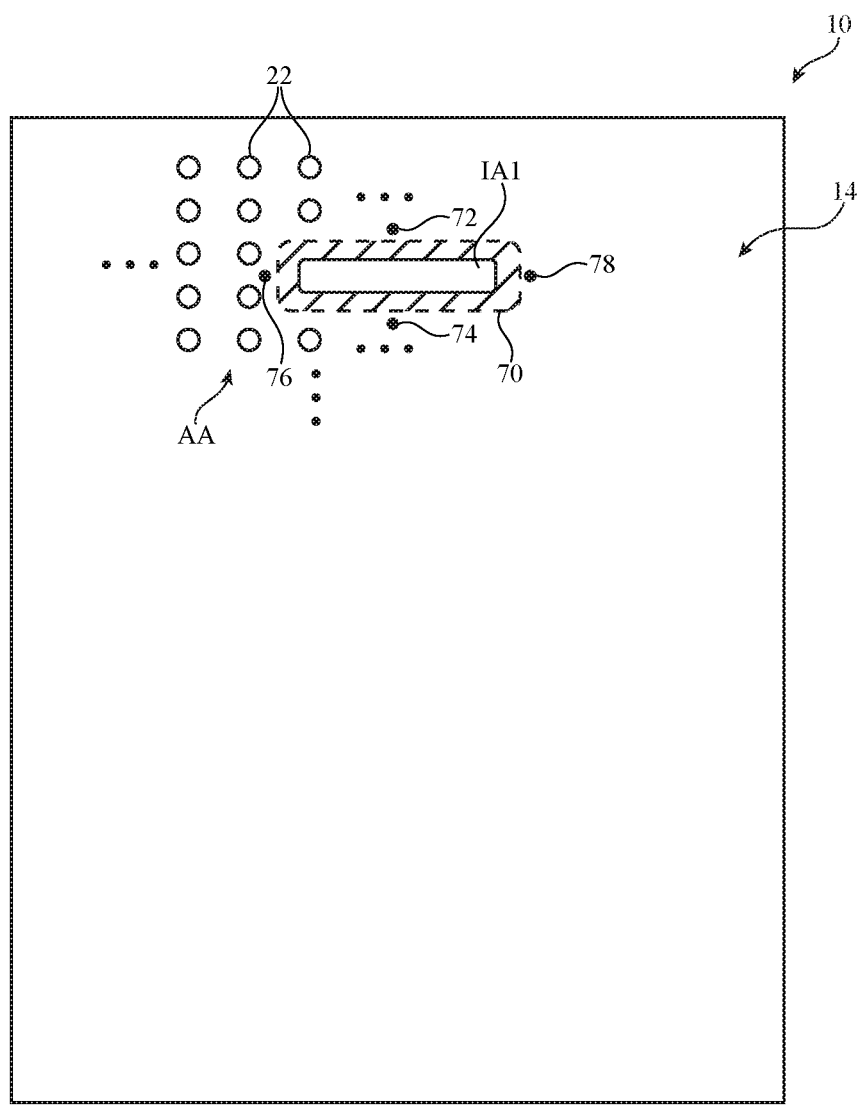
FIG. 4 is a top view of an illustrative display showing how an opening or other region without pixels may be formed within the array of pixels in accordance with an embodiment.

If desired, one or more inactive areas may be formed within the active area of display 14. Consider, as an example, the arrangement of FIG. 4. As shown in FIG. 4, display 14 of device 10 may have an array of pixels 22 that form an active area AA for display 14 and that display image content for a user of device 10. One or more inactive areas such as enclosed inactive area IA1 may be located within active area AA and surrounded by active area AA.

Illustrative enclosed inactive area IA1 of FIG. 4 may be associated with a transparent window (i.e., a region of transparent substrate material that is free of opaque structures and that therefore serves as a light-transparent region through which light can be transmitted and/or received) or may be associated with a physical opening that passes partly or completely through display 14. Configurations in which area IA1 forms an opening in display 14 are sometimes be described herein as an example.

In arrangements of the type shown in FIG. 4, the presence of opening IA1 prevents signal lines of the type shown in FIG. 3 from passing vertically between points 72 and 74 and from passing horizontally between points 76 and 78. Instead, these signal lines may be routed around border region 70 of opening IA1. Border region 70 may be an inactive area that runs along the peripheral edge of opening IA1. Because border 70 is used to accommodate signal lines, border 70 is not available for pixels 22 and is therefore not used in displaying images. The width of border region 70 is preferably minimized so as to minimize the disruption to active area AA due to the presence of opening IA1.

Figure 5:
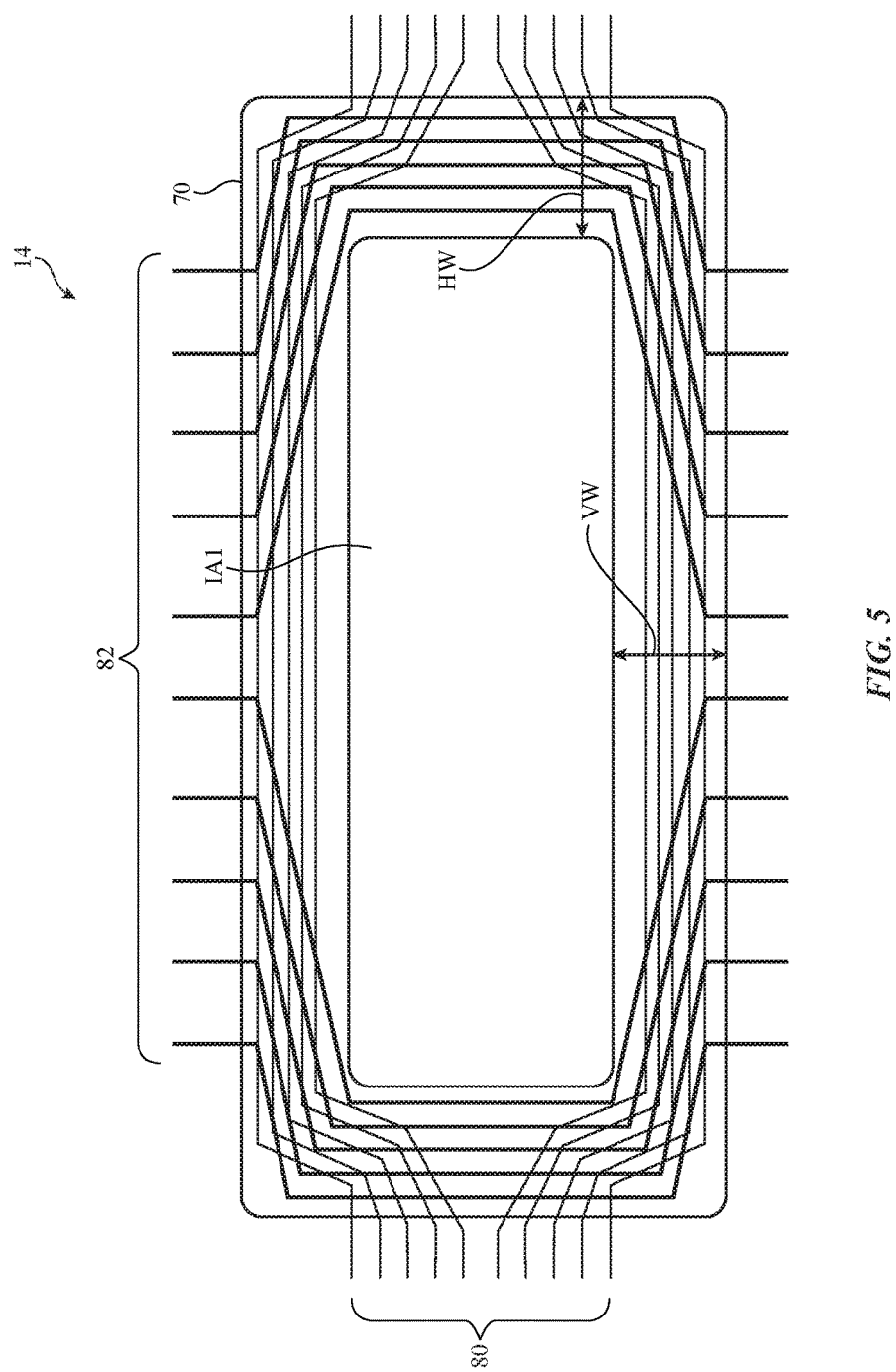
FIG. 5 is a diagram showing how signal lines may be routed around an opening or other inactive display region that is surrounded by portions of the active area in the display in accordance with an embodiment.

FIG. 5 shows how horizontal conductive lines 80 and vertical conductive lines 82 may be routed around opening IA1 within border region 70. Border region 70 may be characterized by a vertical width VW and a horizontal width HW. To minimize disruption to the active area of display 14, widths VW and HW are preferably minimized.

Figure 6:
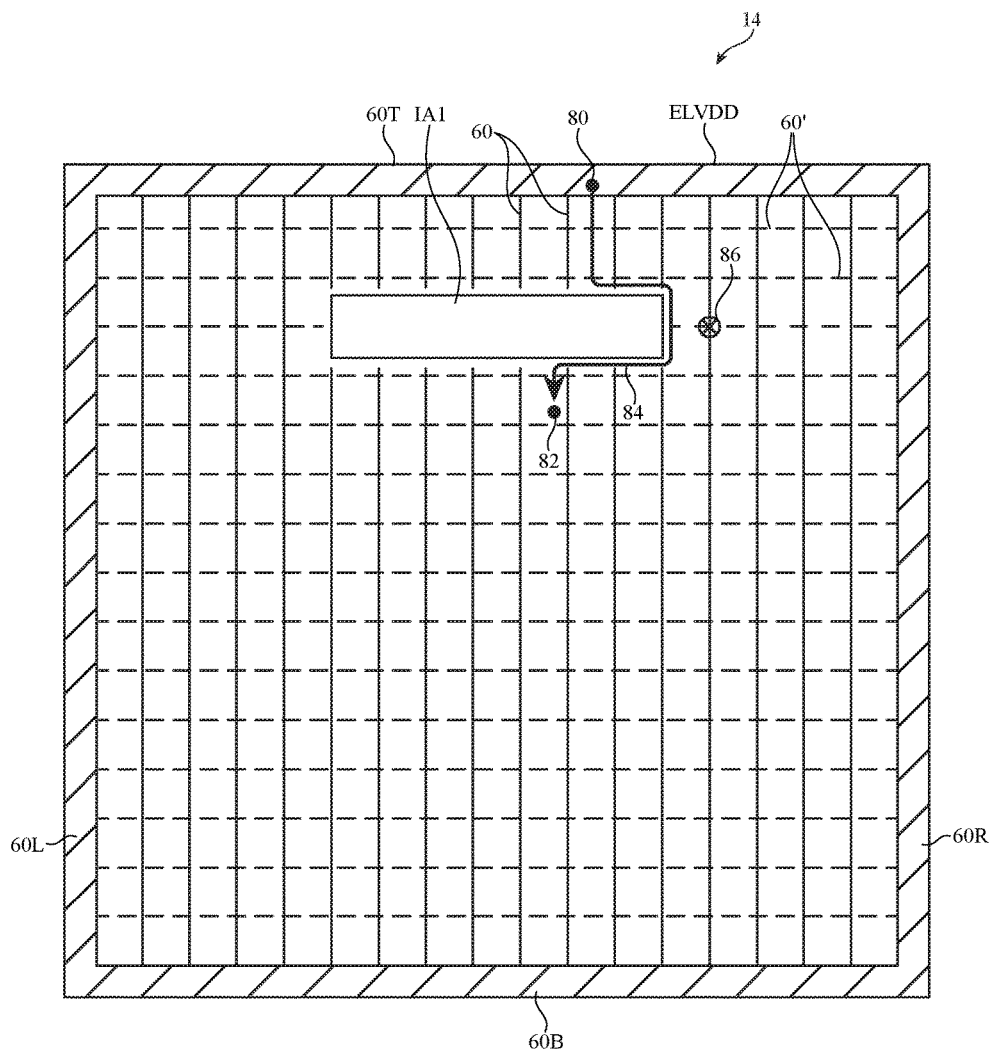
FIG. 6 is a top view of an illustrative set of positive power supply voltage routing lines of the type that may be used in supplying power from a ring-shaped peripheral power supply strip to pixels in a display in accordance with an embodiment.

With one illustrative configuration, the power supply distribution path structures that are used in distributing positive power supply voltage ELVDD to pixels 22 may be excluded from region 70. As shown in FIG. 6, power supply voltage ELVDD may be supplied to a ring of metal having upper power supply strip 60T, lower power supply strip 60B, left power supply strip 60L, and right power supply strip 60R. Strips 60T, 60R, 60B, and 60L may be shorted to each other to form a rectangular ring (as an example). Strips 60T, 60R, 60B, and 60L may be formed from metal and may have a width of about 25-150 microns, more than 50 microns, less than 200 microns, or other suitable width. Strips 60T, 60R, 60B, and 60L may form a peripheral rectangular ring-shaped ELVDD terminal for display 14 that is used in distributing power supply voltage ELVDD to pixels 22 within the active area of display 14 that is enclosed within the rectangular ring-shaped terminal.

Power may be distributed in the active area AA using vertical lines 60 that run along the columns of pixels 22, as described in connection with FIG. 3. Due to the presence of opening IA1, some of the vertical lines 60 will not extend across the entire vertical extent of display 14. To avoid excessive IR drops when distributing power to locations such as pixel location 82, display 14 may be provided with supplemental horizontal power supply distribution lines such as lines 60'. Lines 60' may be formed in a different metal layer than is used in forming lines 60 and may be coupled to lines 60 with an array of vias such as illustrative via 86 to form a grid of power supply distribution lines. A via such as via 86 may be present at each location in which one of lines 60 intersects and overlaps one of lines 60', so that lines 60 and 60' form a mesh shaped power supply distribution path (i.e., a grid of shorted horizontal and vertical lines). Supplemental lines 60' short adjacent vertical lines 60 together, thereby forming short signal paths around opening IA1 such as path 84 from node 80 to point 82. This helps to avoid excessive IR drops when distributing power supply voltage ELVDD to the pixels in the active area. Inactive border area 70 may be free of the lines in the grid of lines 60 and 60', which helps in minimizing the width of inactive border area 70.

Figure 7:
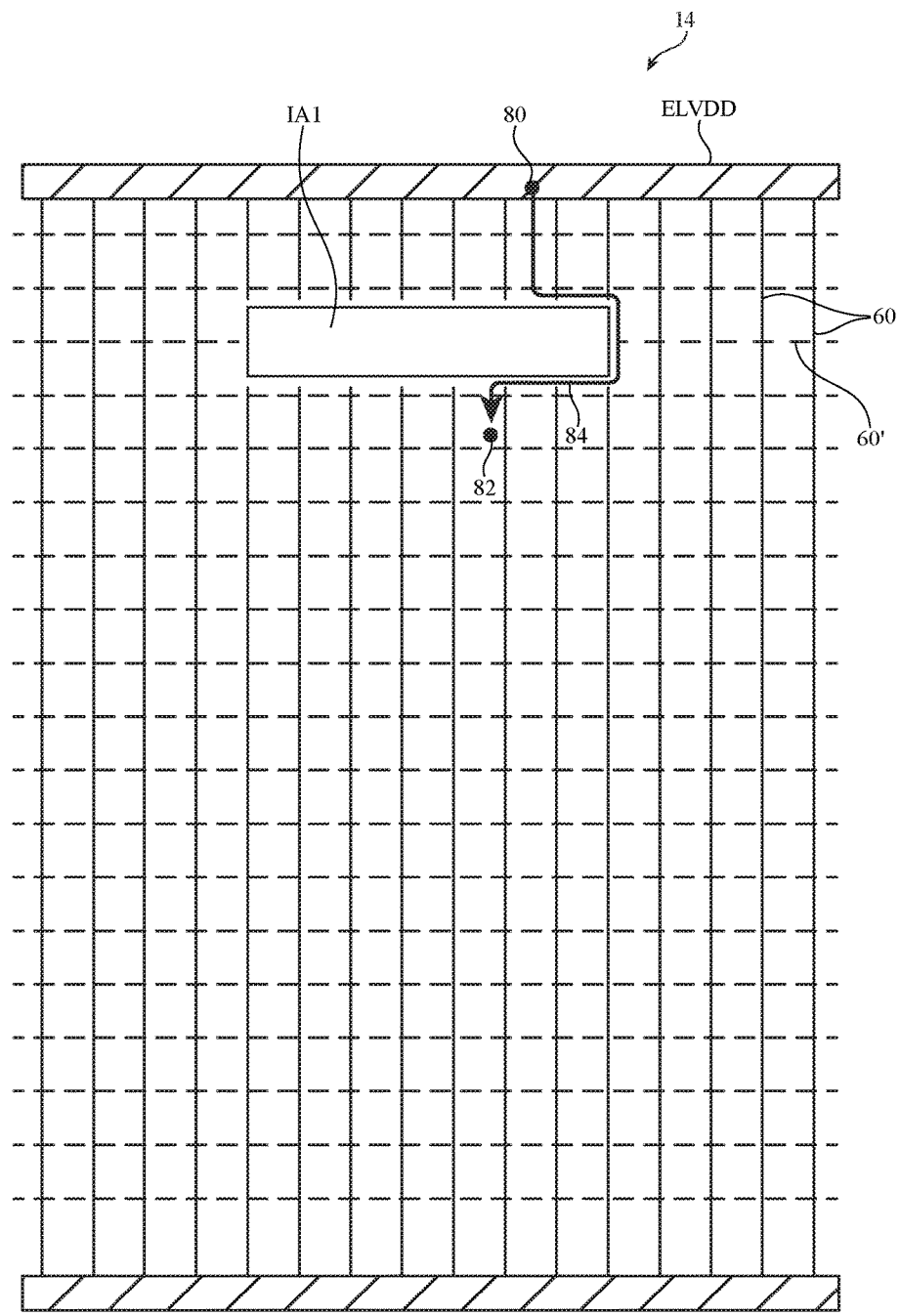
FIG. 7 is a top view of an illustrative set of positive power supply voltage routing lines of the type that may be used in supplying power from a pair of upper and lower horizontal power supply strips in accordance with an embodiment.

Another illustrative ELVDD distribution scheme for display 14 is shown in FIG. 7. In the arrangement of FIG. 7, vertical ELVDD strips such as strips 60L and 60R have been omitted from display 14 to help reduce the width of the left and right borders of display 14. Other distribution schemes may be used for distributing positive power supply voltage ELVDD without including power distribution lines within inactive border 70 of opening IA1, if desired.

Figure 8:
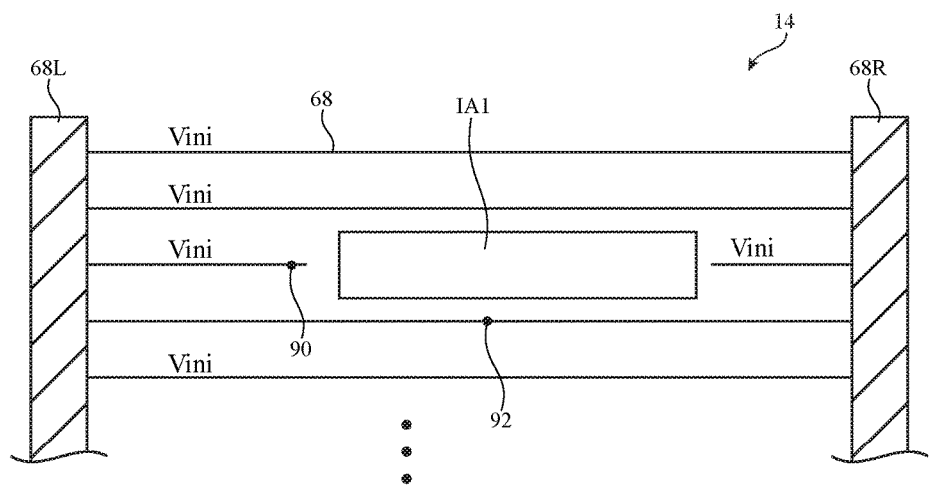
FIG. 8 is a top view of an illustrative patterned set of initialization voltage lines of the type that may be used in supplying an initialization voltage to pixels in a display in accordance with an embodiment.

The number of signal lines in region 70 may be further reduced by eliminating initialization voltage distribution lines 68 from region 70. As shown in FIG. 8, lines 68 may extend horizontally between initialization voltage terminal structures such as left strip 68L and right strip 68R. Although the presence of opening IA1 will interrupt some of lines 68, thereby creating segmented lines each having a first segment on one side of inactive area IA1 and a second segment on an opposing side of inactive area IA1, the distance along lines 68 to pixels at locations such as location 90 and location 92 will not result in excessive IR drops for the initialization voltage Vini. The border region 70 that surrounds the periphery of enclosed inactive area IA1 may therefore be free of initialization voltage lines. The omission of lines 68 from border region 70 may help allow the dimensions of border 90 (see, e.g., widths HW and VW of FIG. 5) to be reduced.

Another way in which to help reduce the dimensions of border 90 involves the use of multiple layers of data lines D. For example, the thin-film transistor circuitry used in forming pixels 22 may be provided with an additional data line metal layer (sometimes referred to as a source-drain metal layer). This additional metal layer may be used to create data lines D' that run above data lines D. When routing data signals through border 90, some of the data signals can be carried by data lines D in a first layer of data lines in the thin-film transistor circuitry and some of the data signals can be carried by data lines D' in a second layer of data lines in the thin-film transistor circuitry. Because each layer of data lines is responsible for carrying only about half of its original number of data line signals, the width of border region 70 that is used to accommodate data line signals can be effectively cut in half.

Figure 9:
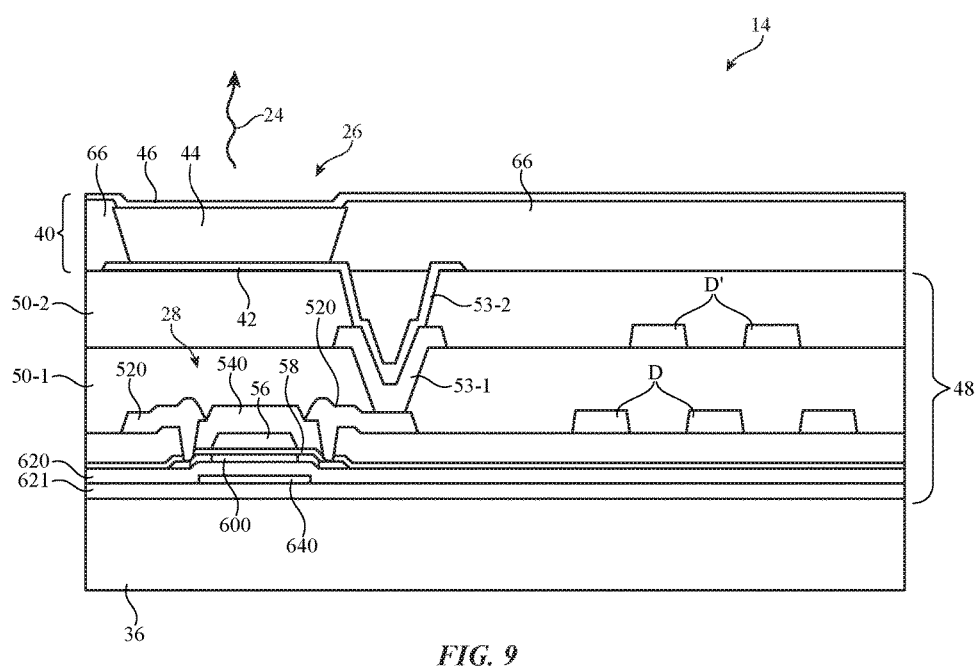
FIG. 9 is a cross-sectional side view of an illustrative organic light-emitting diode and associated thin-film structures in the pixel circuitry of a display showing how multiple layers of signals lines such as multiple layers of data lines may be used for routing signals such as data line signals in accordance with an embodiment.

Multiple layers of data lines can be implemented using any suitable layers of metal in display 14. A cross-sectional side view of an illustrative pixel circuit for one of pixels 22 and associated data lines D and D' is shown in FIG. 9. As shown in FIG. 9, display 14 may include a substrate layer such as substrate layer 36. Substrate 36 may be a planar layer or a non-planar layer and may be formed from plastic, glass, ceramic, sapphire, metal, or other suitable materials. The surface of substrate 36 may, if desired, be covered with one or more buffer layers (e.g., inorganic buffer layers such as layers of silicon oxide, silicon nitride, etc.).

Thin-film transistor circuitry 48 (e.g., a pixel circuit, data distribution lines D and D', etc.) may be formed on substrate 36. The thin film transistor circuitry may include transistors, capacitors, and other thin-film structures. As shown in FIG. 9, a transistor such as thin-film transistor 28 may be formed from thin-film semiconductor layer 600. Semiconductor layer 600 may be a polysilicon layer, a semiconducting-oxide layer such as a layer of indium gallium zinc oxide, or other semiconductor layer. Gate layer 56 may be a conductive layer such as a metal layer that is separated from semiconductor layer 600 by an intervening layer of dielectric such as dielectric 58 (e.g., an inorganic gate insulator layer such as a layer of silicon oxide). Dielectric 620 also be used to separate semiconductor layer 600 from underlying structures such as shield layer 640 (e.g., a shield layer that helps shield the transistor formed from semiconductor layer 600 from charge in buffer layers 621 on substrate 36).

Semiconductor layer 600 of transistor 28 may be contacted by source and drain terminals formed from source-drain metal layer 520. Dielectric layer 540 (e.g., an inorganic dielectric layer) may separate gate metal layer 56 from source-drain metal layer 520. Source-drain metal layer 52 may be shorted to anode 42 of light-emitting diode 26 using a metal via structure. The metal via structure may be a metal via that includes lower via portion 53-1, which passes through a dielectric layer such as lower planarization layer 50-1, and that includes upper via portion 53-2, which passes through a dielectric layer such as upper planarization layer 50-2. Planarization layers 50-1 and 50-2 may be formed from an organic dielectric material such as a polymer.

Portions of the metal layer that form source-drain terminals 520 for transistor 28 may be used in forming data lines D on dielectric layer 540 under planarization layer 50-1. Portions of the metal layer that form via 53-1 may form supplemental data lines D' on planarization layer 50-1. Upper planarization layer 50-2 may overlap data lines D' and layer 50-1, so that data lines D' are interposed between upper planarization layer 50-2 and lower planarization layer 50-1.

Light-emitting diode 26 is formed from light-emitting diode layers 40 on thin-film transistor layers 48. Each light-emitting diode has a lower electrode and an upper electrode. In a top emission display, the lower electrode may be formed from a reflective conductive material such as patterned metal to help reflect light that is produced by the light-emitting diode in the upwards direction out of the display. The upper electrode (sometimes referred to as the counter electrode) may be formed from a transparent or semi-transparent conductive layer (e.g., a thin layer of transparent or semitransparent metal and/or a layer of indium tin oxide or other transparent conductive material). This allows the upper electrode to transmit light outwards that has been produced by emissive material in the diode. In a bottom emission display, the lower electrode may be transparent (or semi-transparent) and the upper electrode may be reflective.

In configurations in which the anode is the lower electrode, layers such as a hole injection layer, hole transport layer, emissive material layer, and electron transport layer may be formed above the anode and below the upper electrode, which serves as the cathode for the diode. In inverted configurations in which the cathode is the lower electrode, layers such as an electron transport layer, emissive material layer, hole transport layer, and hole injection layer may be stacked on top of the cathode and may be covered with an upper layer that serves as the anode for the diode.

In general, display 14 may use a configuration in which the anode electrode is closer to the display substrate than the cathode electrode or a configuration in which the cathode electrode is closer to the display substrate than the anode electrode. In addition, both bottom emission and top emission arrangements may be used. Top emission display configurations in which the anode is located on the bottom and the cathode is located on the top are sometimes described herein as an example. This is, however, merely illustrative. Any suitable display arrangement may be used, if desired.

In the illustrative configuration of FIG. 9, display 14 has a top emission configuration and lower electrode 42 is an anode and upper electrode 46 is a cathode (see, e.g., ELVSS layer 62 of FIG. 3). Layers 40 include a patterned metal layer that forms anodes such as anode 42. Anode 42 is formed within an opening in pixel definition layer 66. Pixel definition layer 66 may be formed from a patterned photoimageable polymer (e.g., an opaque polymer).

In each light-emitting diode, organic emissive material 44 is interposed between a respective anode 42 and cathode 46. Anodes 42 may be patterned from a layer of metal on a planarization layer in the thin-film transistor layers of pixel circuit 48 such as upper planarization layer 50-2. Cathode 46 may be formed from a common conductive layer that is deposited on top of pixel definition layer 66. Cathode 46 is transparent so that light 24 may exit light emitting diode 26 as current is flowing through emissive material 44 between anode 42 and cathode 46.

As shown in FIG. 9, because there are two planarization layers (layers 50-1 and 50-2) in display 14, display 14 can use two layers of data lines to carry two sets of data signals in parallel. A lower set of data signals may be carried on the data lines D formed on layer 540 and an upper set of data signals may be carried on the data lines D' formed between planarization layers 50-1 and 50-2. Because there are more layers of data lines available to carry data signals through region 90 as the vertical data lines running through display 14 are routed around opening IA1, the width of region 90 can be minimized. Two-layer data signal schemes such as the arrangement of FIG. 9 may be used in a display in which ELVDD signals are routed using a mesh of horizontal and vertical power supply distribution lines (e.g., lines 60 and 60' of FIGS. 6 and 7) without routing these lines through border 70, may be used in a display in which initialization voltage lines such as lines 68 of FIG. 8 are divided into segments by the presence of opening IA1 without routing the initialization voltage lines through border 70, and/or may be used in displays with other power supply and initialization voltage routing schemes. Display 14 may have a single opening (or other enclosed inactive area surrounded by active area) such as illustrative opening IA1 or may have multiple inactive areas of this type each of which has a respective peripheral edge with a border such as border 70 with a minimized width.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
    an array of pixels each of which has a light-emitting diode coupled to thin-film transistor circuitry;
    an enclosed inactive area formed from an opening in the array of pixels that is surrounded by the array of pixels;
    an inactive border that runs along a peripheral edge of the enclosed inactive area; and
    signal lines that pass through the inactive border.

2. The display defined in claim 1 wherein the thin-film transistor circuitry includes two layers of data lines.

3. The display defined in claim 2 wherein the signal lines include data lines from each of the two layers of data lines.

4. The display defined in claim 3 further comprising a dielectric planarization layer that separates the two layers of data lines.

5. The display defined in claim 3 wherein the two layers of data lines include a first layer of data lines and a second layer of data lines, the display further comprising:
    a first dielectric planarization layer that separates the first and second layers of data lines; and
    a second dielectric planarization layer, wherein the second layer of data lines is interposed between the first and second dielectric planarization layers.

6. The display defined in claim 5 wherein each light-emitting diode includes an anode that is coupled to a thin-film transistor in the thin-film transistor circuitry using via structures that pass through the first and second dielectric planarization layers.

7. The display defined in claim 6 further comprising initialization voltage lines that supply initialization voltages to the pixels during transistor threshold voltage compensation operations, wherein the initialization voltage lines include at least some segmented initialization voltages lines each of which has a first segment on a first side of the enclosed inactive area and a second segment on an opposing second side of the enclosed inactive area.

8. The display defined in claim 7 wherein the inactive border of the enclosed inactive area is free of initialization voltage lines.

9. The display defined in claim 8 further comprising a grid of positive power supply lines that supply power to the pixels, wherein the inactive border of the enclosed inactive area is free of the positive power supply lines.

10. The display defined in claim 1 further comprising a grid of power supply lines including vertical power supply lines and horizontal power supply lines, wherein the grid of power supply lines routes a positive power supply voltage to each of the pixels.

11. The display defined in claim 10 further comprising initialization voltage lines that supply initialization voltages to the pixels during transistor threshold voltage compensation operations, wherein the initialization voltage lines include at least some segmented initialization voltages lines each of which has a first segment on a first side of the enclosed inactive area and a second segment on an opposing second side of the enclosed inactive area.

12. The display defined in claim 11 wherein the inactive border of the enclosed inactive area is free of initialization voltage lines.

13. The display defined in claim 12 wherein the pixel circuits are formed from thin-film transistor circuitry having two layers of data lines, wherein the two layers of data lines include a first layer of data lines and a second layer of data lines, the display further comprising:
 a first dielectric layer that separates the first and second layers of data lines; and
 a second dielectric layer, wherein the second layer of data lines is interposed between the first and second dielectric layers.

14. The display defined in claim 13 further comprising a grid of positive power supply lines that supply power to the pixel circuits, wherein the inactive border of the enclosed inactive area is free of positive power supply lines.

15. A display, comprising:
 an array of pixels each of which has a light-emitting diode coupled to thin-film transistor circuitry;
 an inactive area formed from an opening in the array of pixels;
 an inactive border that runs along a peripheral edge of the inactive area; and
 two layers of data lines formed from the thin-film transistor circuitry, wherein at least some of the data lines pass through the inactive border.

16. The display defined in claim 15 further comprising initialization voltage lines that supply initialization voltages to the pixels during transistor threshold voltage compensation operations, wherein the initialization voltage lines include at least some segmented initialization voltages lines each of which has a first segment on a first side of the inactive area and a second segment on an opposing second side of the inactive area and wherein the inactive border of the inactive area is free of initialization voltage lines.

17. The display defined in claim 16 further comprising a grid of positive power supply lines that supply power to the thin-film transistor circuitry, wherein the inactive border of the inactive area is free of positive power supply lines.

18. The display defined in claim 17 wherein the two layers of data lines include a first layer of data lines and a second layer of data lines, the display further comprising:
 a first organic dielectric planarization layer that separates the first and second layers of data lines; and
 a second organic planarization layer, wherein the second layer of data lines is interposed between the first and second organic dielectric planarization layers.

19. A display, comprising:
 an array of pixels each of which has a light-emitting diode;
 an enclosed inactive area formed from an opening in the array of pixels, wherein the enclosed inactive area is surrounded by the array of pixels;
 an inactive border that runs along a peripheral edge of the enclosed inactive area; and
 two layers of data lines formed from thin-film transistor circuitry within the array of pixels, wherein at least some of the data lines in each of the two layers of data lines pass through the inactive border.

20. The display defined in claim 19 further comprising:
 initialization voltage lines that supply initialization voltages to the pixels during transistor threshold voltage compensation operations, wherein the inactive border of the enclosed inactive area is free of initialization voltage lines;
 a grid of positive power supply lines, wherein the inactive border of the enclosed inactive area is free of the positive power supply lines; and
 signal lines that pass through the inactive border and that supply control signals to at least some of the pixel circuits.

* * * * *